United States Patent
Schrittwieser et al.

(10) Patent No.: US 11,570,904 B2
(45) Date of Patent: Jan. 31, 2023

(54) METHOD FOR CONTACTING AND REWIRING AN ELECTRONIC COMPONENT EMBEDDED INTO A PRINTED CIRCUIT BOARD

(71) Applicant: AT&S Austria Technologie & Systemtechnik Aktiengesellschaft, Leoben (AT)

(72) Inventors: Wolfgang Schrittwieser, Kapfenberg (AT); Mike Morianz, Graz (AT); Alexander Kasper, Graz (AT); Erich Preiner, St. Michael (AT); Thomas Krivec, Zeltweg (AT)

(73) Assignee: AT&S Austria Technologie & Systemtechnik, Leoben (AT)

( * ) Notice: Subject to any disclaimer, the term of this patent is extended or adjusted under 35 U.S.C. 154(b) by 470 days.

(21) Appl. No.: 16/841,535

(22) Filed: Apr. 6, 2020

(65) Prior Publication Data
US 2020/0305286 A1 Sep. 24, 2020

Related U.S. Application Data

(62) Division of application No. 14/902,813, filed as application No. PCT/AT2014/050137 on Jun. 23, 2014, now Pat. No. 10,645,816.

(30) Foreign Application Priority Data

Jul. 4, 2013 (AT) ............................ A 50439/2013

(51) Int. Cl.
*H05K 7/00* (2006.01)
*H05K 3/32* (2006.01)
(Continued)

(52) U.S. Cl.
CPC ........... *H05K 3/32* (2013.01); *H01L 23/5389* (2013.01); *H01L 24/24* (2013.01); *H01L 24/82* (2013.01);
(Continued)

(58) Field of Classification Search
CPC .......... H05K 3/32; H05K 1/0298; H05K 1/09; H01L 24/24; H01L 24/82
(Continued)

(56) References Cited

U.S. PATENT DOCUMENTS 6,724,638 B1   4/2004   Inagaki et al.
6,905,810 B2   6/2005   Yoshida et al.
(Continued)

FOREIGN PATENT DOCUMENTS

CN   1321411 A   11/2001
CN   1438833 A   8/2003
(Continued)

OTHER PUBLICATIONS

International Search Report for Application No. PCT/AT2014/050137, Search completed Nov. 6, 2014, dated Nov. 21, 2014, 4 Pgs.

*Primary Examiner* — Andargie M Aychillhum
(74) *Attorney, Agent, or Firm* — KPPB LLP

(57) ABSTRACT

A method for contacting and rewiring an electronic component embedded in a PCB in the following manner is disclosed. A first permanent resist layer is applied to one contact side of the PCB. The first permanent resist layer is structured to produce exposures in the area of contacts of the electronic component. A second permanent resist layer is applied onto the structured first permanent resist layer. The second permanent resist layer is structured to expose the exposures in the area of the contacts and to produce exposures in line with the desired conductor tracks. The expo-
(Continued)

sures are chemically coated with copper the copper is electric-plated to the exposures. Excess copper in the areas between the exposures is removed.

18 Claims, 2 Drawing Sheets

(51) Int. Cl.
  *H05K 1/18* (2006.01)
  *H01L 23/00* (2006.01)
  *H01L 23/538* (2006.01)
  *H05K 1/02* (2006.01)
  *H05K 1/09* (2006.01)
  *H05K 3/46* (2006.01)
  *H05K 3/02* (2006.01)
  *H01L 21/56* (2006.01)
  *H05K 3/00* (2006.01)

(52) U.S. Cl.
  CPC ............. *H05K 1/0298* (2013.01); *H05K 1/09* (2013.01); *H05K 1/185* (2013.01); *H05K 3/4697* (2013.01); *H01L 21/568* (2013.01); *H01L 2224/04105* (2013.01); *H01L 2224/8203* (2013.01); *H01L 2224/92144* (2013.01); *H05K 3/0026* (2013.01); *H05K 3/02* (2013.01); *H05K 2201/0195* (2013.01); *H05K 2201/09509* (2013.01); *H05K 2201/10674* (2013.01); *H05K 2203/0574* (2013.01); *H05K 2203/1469* (2013.01)

(58) Field of Classification Search
  USPC .......................................................... 361/783
  See application file for complete search history.

(56) References Cited

U.S. PATENT DOCUMENTS

| | | | |
|---|---|---|---|
| 7,696,442 B2 | 4/2010 | Muramatsu et al. | |
| 10,645,816 B2 | 5/2020 | Schrittwieser et al. | |
| 2009/0277673 A1* | 11/2009 | Sohn | H05K 1/185 |
| | | | 29/829 |
| 2009/0301766 A1* | 12/2009 | Park | H01L 24/82 |
| | | | 29/855 |
| 2010/0212946 A1 | 8/2010 | Shimizu et al. | |
| 2016/0183383 A1 | 6/2016 | Schrittwieser et al. | |

FOREIGN PATENT DOCUMENTS

| | | |
|---|---|---|
| CN | 105359633 A | 2/2016 |
| EP | 3017666 B1 | 8/2017 |
| TW | 200518655 A | 6/2005 |
| WO | 2010048653 A2 | 5/2010 |
| WO | 2010048653 A3 | 5/2010 |
| WO | 2010048654 A1 | 5/2010 |
| WO | 2015000007 A1 | 1/2015 |

* cited by examiner

METHOD FOR CONTACTING AND REWIRING AN ELECTRONIC COMPONENT EMBEDDED INTO A PRINTED CIRCUIT BOARD

CROSS REFERENCE TO RELATED APPLICATIONS

This application is divisional of U.S. patent application Ser. No. 14/902,813 filed on Jan. 4, 2016, which is a national stage of Application No. PCT/AT2014/050137 filed on Jun. 23, 2014, which application claims priority to Austrian Patent Application No. A 50439/2013 filed Jul. 4, 2013, the disclosures of which are hereby incorporated by reference in their entireties.

FIELD OF THE INVENTION

The invention concerns a method for connecting and rewiring an electronic component embedded in a PCB as well as a corresponding PCB.

BACKGROUND

With PCBs for the assembly and electrical connection of semiconductor elements, the tendency is more and more towards miniaturisation, whereby the semiconductor elements are increasingly integrated into the PCB saving space and not fixed onto the surface of them. The semiconductor elements are hereby embedded in the electrically insulating PCB material—usually a prepreg material such as FR4 material—in such a way that the entire volume of the semiconductor element is secured in the cross section of the PCB and merely the contacts or connections of the semiconductor element are exposed on the contact side of the PCB mainly planar on the surface of the PCB. This makes them accessible for the wiring of the semiconductor element through the conductor tracks formed from an electrically conducive material such as copper or aluminium on the PCB. Such PCBs with integrated semiconductor elements mostly reveal a large number of layers that are alternatingly electrically insulated and for the formation of conductor tracks that are laminated in a sequential process on top of each other so that the embedded semiconductor elements are usually covered by such layers before being connected.

According to the known methods from the best available technology, such covered contacts or connections of the semiconductor elements are exposed by way of a laser cutting method where a laser beam cuts the layers made from insulating material from the surface of the PCB covering the contacts or connections of the semiconductor element down to the metal of the contact whereby the exposed areas are filled with copper or another electrical conductor, in order to accomplish the contacting.

The laser cutting method is, however, unfavourable as the heat produced by the laser can lead to damage to the sensitive semiconductor elements where semiconductor elements and thus PCBs are becoming increasingly smaller.

SUMMARY OF THE INVENTION

The aim of this invention is thus to state a method as mentioned at the beginning by means of which highly small-scale semiconductor elements and accordingly dimensioned PCBs can be provided with precise contacting and wiring of the semiconductor elements on the PCB, whereby an excessive impact of heat on the PCB and thus related damage to the semiconductor element are to be avoided. This problem is solved by a method that is characterized by way of this invention in the following steps:

Application of a first permanent resist layer to one contact side of the PCB,

Structuring of the first permanent resist layer to produce exposures around the contacts of the electronic component Application of at least one second permanent resist layer onto the structured first permanent resist layer Structuring of the first permanent resist layer to produce exposures around the contacts and to produce exposures according to the desired conductor tracks.

Chemical coating of the exposures with copper Electrical plating of the exposures with copper Removal of excess copper around the exposures.

With the method according to this invention, the intention is thus to form the exposures for the contacting and wiring of the semiconductor elements in layers of permanent resist instead of with conventional insulating layers of prepreg material such as FR4, so that it is not necessary to remove the layers covering the contacts or connections of the semiconductor elements by way of laser cutting, but merely structuring the permanent resist layer by way of exposing, developing and removing or stripping the areas formed. The photoresist or permanent resist thus remains hereby in the non-structured areas on the finished PCB and serves in those areas of the PCB in which the contacting and wiring or disentangling of the PCB elements consequently as dielectric instead of the conventional prepreg material such as FR4 or polyimide. Due to the fact that the laser cutting method can be foregone, damage to the PCB and the semiconductor element embedded therein can be avoided.

DESCRIPTION OF THE DRAWINGS

The description will be more fully understood with reference to the following figures, which are presented as exemplary embodiments of the invention and should not be construed as a complete recitation of the scope of the invention, wherein.

DETAILED DESCRIPTION OF THE INVENTION

Figure 1A:
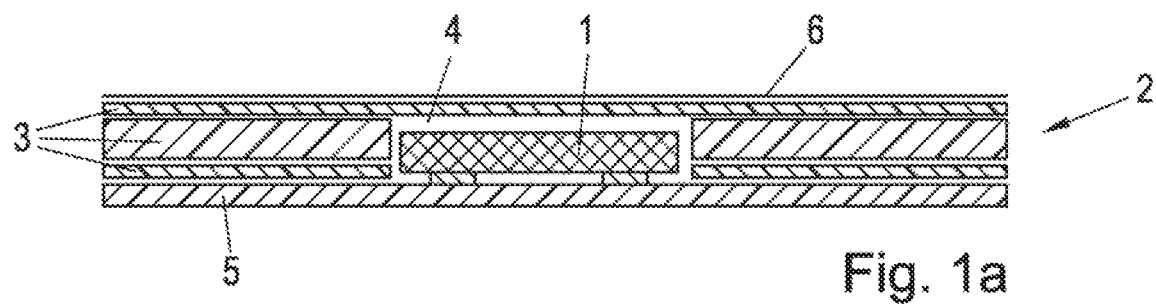
FIGS. 1a to 1i illustrate cross sectional views of a printed circuit board with an embedded component and a process for producing such in accordance with embodiments of the invention.
Figure 1B:
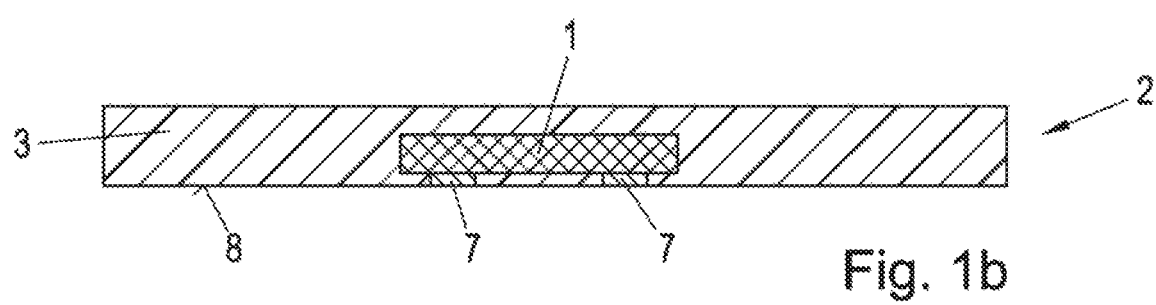
Figure 1C:
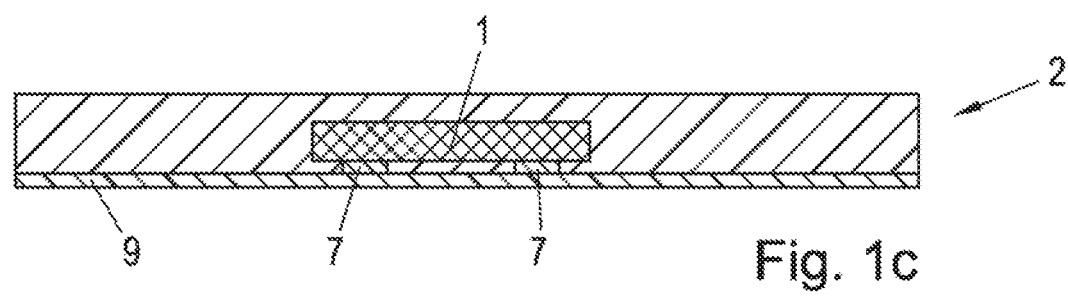
Figure 1D:
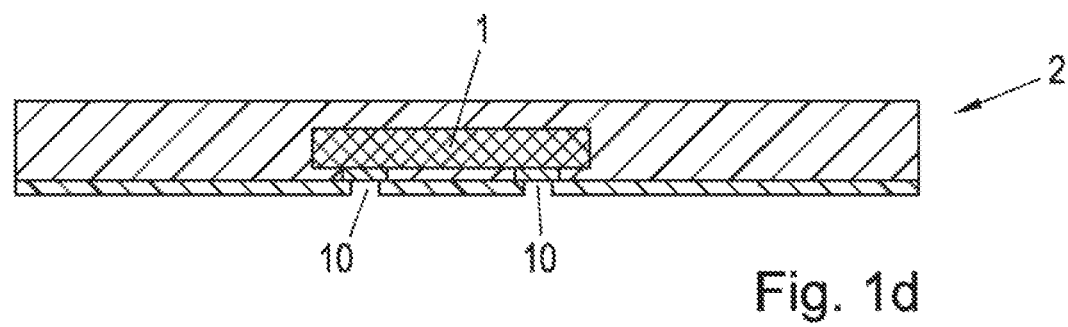
Figure 1E:
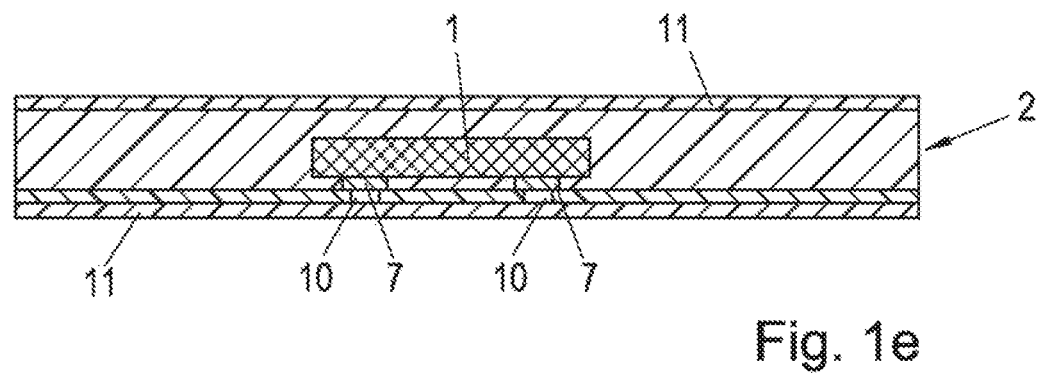
Figure 1F:
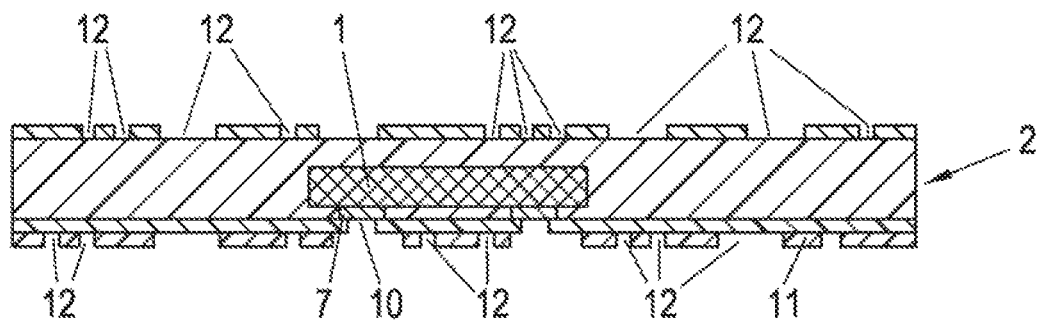
Figure 1G:
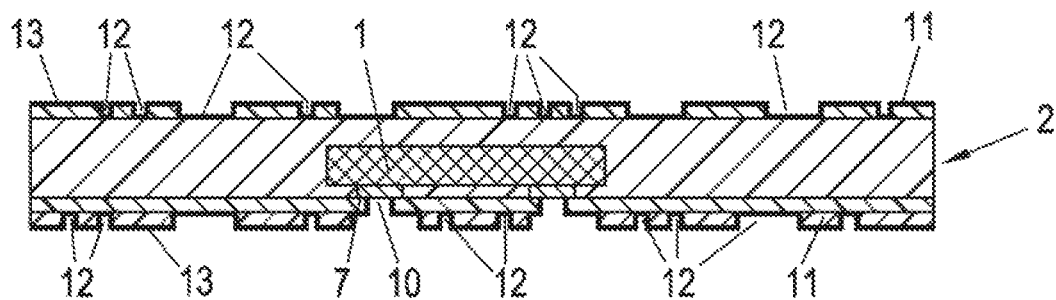
Figure 1H:
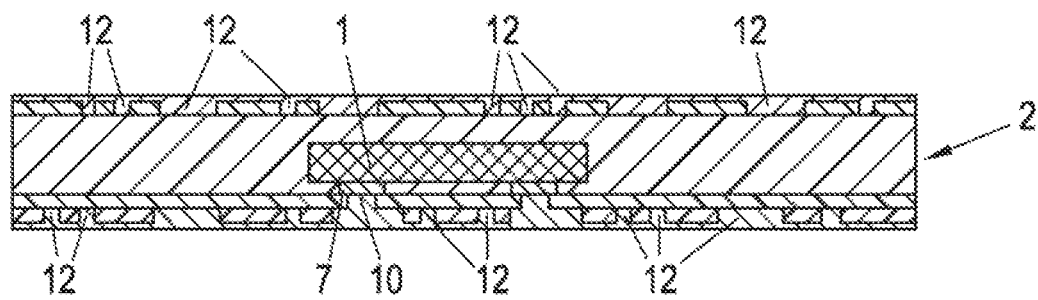
Figure 1I:
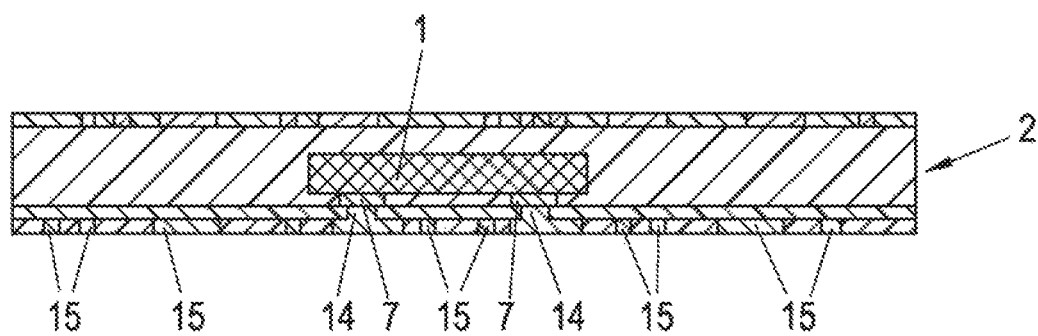

In order to make better use of the space on the PCB for the rewiring of electronic components such as semiconductor elements, the invention is preferably further developed to the effect that the step of application at least covers a second permanent resist layer in addition to the application of a permanent resist layer on the side of the PCB opposite the contact side of the PCB. In the following structuring step of the second permanent resist layer, this permanent resist layer is also structured to form conductor tracks also on the side of the PCB opposite to the contact side of the PCB. The result of this favoured method is thus a PCB with structured electrically conducive layers on both sides of the PCB, whereby the electrically conducive layers are produced by filling the exposures with permanent resist or photoresist.

Conventionally, permanent resist materials are exposed in such a way that the continuous photoresist layer is printed with a lightproof mask, then exposed and subjected to chemical treatment, by means of which and depending on the type of resist, the unexposed or the exposed area remains and the remaining areas are removed. In the case of so-called positive resists, the covered and thus unexposed areas remain whereby in the case of negative resists, the uncovered and thus exposed areas remain. The printing of the mask is thus a relatively complex step. This is the reason why in using a comparatively improved and thus favoured method of this invention, it is intended that the structuring of the permanent resist layers covers the exposure of the permanent resist layers. A laser beam corresponding to the desired exposed image is guided over the continuous permanent resist layer so that the application of a photolithographic mask can be foregone.

In the following, the invention will be described in more detail in the drawing based on the example presented. In this, FIGS. 1a) to 1i) display schematic sectional views of the individual steps of the method according to this invention. To avoid repetitions, the same parts of the PCB are given the same reference numbers in the drawings.

FIG. 1a) shows a semiconductor element with number 1. Semiconductor element 1 is taken within the cross-section of the PCB 2. FIG. 1a) shows the PCB prior to a lamination step and it is recognisable that the individual prepreg layers 3 form a recess that contains the semiconductor element 1. In the state in FIG. 1a), the resin of the individual layers has not yet fully spread nor hardened. As with this particular manufacturing method the semiconductor element is not glued into pre-hardened prepreg layers but the resin of the prepreg layers is poured over it, it is necessary to temporarily affix semiconductor element 1 in recess 4 with the help of adhesive band 5 prior to lamination where the prepreg hardens. An additional film is applied for lamination purposes. After lamination of this compound and removing adhesive band 5 as well as film 6, the result is the product as per FIG. 1 b), where prepreg layers 3 flow together into a practically homogenous prepreg layer 3 and harden out afterwards. Semiconductor 1 defines with its exposed contacts 17 a contact side 8 of PCB 2 on which the contacting and wiring of semiconductor 1 takes place.

As per the diagram in FIG. 1 c), now a first permanent resist layer 9 is applied to contact side 8 of PCB 2 and structured by way of exposure developing and stripping, whereby exposures 10 are formed, which make contacts 7 accessible for the contacting that follows later (FIG. 1 d)). The exposure can, as described above, be done with a laser. When developing the first permanent resist layer, the remaining photoresist is chemically changed such that after exposing the same material, there is no further development.

Subsequently, a second permanent resist layer 11 is applied (FIG. 1 e)), which does indeed at least partially close up exposures 11 formed in the step described above, but predominantly creates the possibility by way of suitable structuring of this fresh second permanent resist layer 11 to create exposures 12 in line with the desired conductor tracks (FIG. 1 f)), whereby it must be emphasised that in the event of the application step of a second permanent resist layer 11 covers the application of a permanent resist layer 11 on the side of PCB 2 opposite contact side 8 of PCB 2.

This is followed by the step of chemical treatment with copper of exposures 10 and 12, whereby a thin layer of copper 13 is applied to the permanent resist material and particularly to exposures 10 and 12 (FIG. 1 g). Now exposures 10 and 12 can be electrically plated with copper, whereby a product as displayed in FIG. 1 h) remains intact. Finally, the excess copper in the areas around exposures 10 and 12 must be removed to obtain the finished PCB 2 (FIG. 1 i). Contacting 14 of contacts 7 of the semiconductor element 1 and conductor tracks 15 were developed by the method as per this invention without having heated semiconductor element 1 excessively.

It goes without saying that the PCB gained in this way can be subjected to further processing steps without deviating from the spirit of the invention presented herein.

What is claimed is:

1. A printed circuit board comprising:
   a core material substrate;
   an electronic component having at least one contact element, wherein the electronic component is embedded within the core material substrate such that the at least one contact element is exposed on a contact surface of the core material substrate and configured to be substantially planar with respect to the contact surface of the core material substrate;
   a first dielectric layer disposed on the contact side of the core material substrate, wherein the first dielectric layer is structured such that it has a first exposure in the area of the at least one contact element, wherein the first exposure has a first width forming a first stepped transition between an outer surface of the first dielectric layer and the at least one contact element; and
   a second dielectric layer, wherein the second dielectric layer is structured such that it has a second exposure in the area of the at least one contact element, and wherein the second exposure has a second width that is wider than the first width such that second exposure forms a second stepped transition between the first and second dielectric layers and the at least one contact element.

2. The PCB of claim 1, wherein the first and/or second dielectric layer is a permanent resist layer.

3. The PCB of claim 1, wherein the first and/or second dielectric layer is a photoresist layer.

4. The PCB of claim 3, wherein the first and/or the second dielectric layer is/are selected from the group consisting of positive photoresist and negative photoresist.

5. The PCB of claim 1, wherein the second dielectric layer is disposed directly on top of the first dielectric layer.

6. The PCB of claim 1, further comprising a copper coating disposed on the first and second exposures.

7. The PCB of claim 6, wherein the copper coating is a chemical coating.

8. The PCB of claim 6, wherein the copper coating is an electric-plating coating.

9. The PCB of claim 1, further comprising a plurality of conductor tracks disposed on the second dielectric layer.

10. The PCB of claim 1, wherein the at least one contact element has an outside surface that is flush with an outside surface of the core substrate material.

11. The PCB of claim 1, further comprising a plurality of conductor tracks disposed in line with the plurality of first and second exposures in the area of the at least one contact element.

12. The PCB of claim 1, further comprising a plurality of contact elements.

13. The PCB of claim 1, further comprising a third dielectric layer disposed on a side of the core material substrate opposite the contact side.

14. The PCB of claim 13, wherein the third dielectric layer is a permanent resist layer.

15. The PCB of claim 13, wherein the third dielectric layer is a photoresist layer.

16. The PCB of claim 1, wherein the core substrate material is a prepreg material.

17. The PCB of claim 1, wherein the core substrate material is a multi-layered core substrate having a plurality of individual layers.

18. The PCB of claim 17, wherein each of the plurality of individual layers forming the multi-layered core substrate is a prepreg material.

\* \* \* \* \*